(12) United States Patent
Okuno et al.

(10) Patent No.: US 10,957,880 B2
(45) Date of Patent: Mar. 23, 2021

(54) ELECTRO-OPTICAL PANEL

(71) Applicant: LG Display Co., Ltd., Seoul (KR)

(72) Inventors: Harumi Okuno, Tokyo (JP); Osamu Sato, Tokyo (JP)

(73) Assignee: LG Display Co., Ltd., Seoul (KR)

( * ) Notice: Subject to any disclaimer, the term of this patent is extended or adjusted under 35 U.S.C. 154(b) by 186 days.

(21) Appl. No.: 16/247,175

(22) Filed: Jan. 14, 2019

(65) Prior Publication Data
US 2019/0148678 A1    May 16, 2019

Related U.S. Application Data

(63) Continuation of application No. 15/366,785, filed on Dec. 1, 2016, now Pat. No. 10,217,968.

(30) Foreign Application Priority Data

Apr. 28, 2016   (JP) .............................. JP2016-091566

(51) Int. Cl.
| | |
|---|---|
| *H01L 51/52* | (2006.01) |
| *G02F 1/13* | (2006.01) |
| *G02F 1/1333* | (2006.01) |
| *G02B 5/30* | (2006.01) |
| *H01L 51/00* | (2006.01) |
| *H01L 51/56* | (2006.01) |

(52) U.S. Cl.
CPC ........ *H01L 51/5281* (2013.01); *G02B 5/3033* (2013.01); *G02B 5/3083* (2013.01); *G02F 1/13* (2013.01); *G02F 1/133305* (2013.01); *H01L 51/0097* (2013.01); *H01L 51/56* (2013.01); *H01L 51/5243* (2013.01); *H01L 2251/5338* (2013.01); *Y02E 10/549* (2013.01)

(58) Field of Classification Search
CPC . H01L 51/5281; H01L 51/0097; H01L 51/56; H01L 2251/5338; H01L 51/5243; G02F 1/133305; G02F 1/13; G02B 5/3033; G02B 5/3083; Y02E 10/549; H05B 33/02; G09G 2380/02
See application file for complete search history.

(56) References Cited

U.S. PATENT DOCUMENTS

| | | |
|---|---|---|
| 7,327,923 B2 | 2/2008 | Hart et al. |
| 7,465,678 B2 | 12/2008 | Bhattacharya et al. |

(Continued)

FOREIGN PATENT DOCUMENTS

| | | |
|---|---|---|
| CN | 101114075 A | 1/2008 |
| CN | 101149511 A | 3/2008 |

(Continued)

OTHER PUBLICATIONS

Intellectual Property India, Examination Report, IN Patent Application No. 201614044859, dated Apr. 22, 2019, six pages.

(Continued)

*Primary Examiner* — Bac H Au
(74) *Attorney, Agent, or Firm* — Fenwick & West LLP (57) ABSTRACT

An electro-optical panel includes: an electro-optical element emitting a light or adjusting a transmittance of a light; and a stretch film including a polymeric material, wherein a main stretching axis direction of the stretch film is disposed within a range of ±30° with respect to a side of the electro-optical panel.

11 Claims, 9 Drawing Sheets

(56) References Cited

U.S. PATENT DOCUMENTS

| | | |
|---|---|---|
| 7,511,785 B2 | 3/2009 | Ito et al. |
| 7,804,565 B2 | 9/2010 | Saitoh et al. |
| 8,212,970 B2 | 7/2012 | Nagata |
| 8,405,308 B2 | 3/2013 | Matsudate et al. |
| 8,802,813 B2 | 8/2014 | Adlem et al. |
| 8,842,243 B2 | 9/2014 | Kaihoko |
| 8,901,268 B2 | 12/2014 | Krishnamoorthy et al. |
| 9,040,129 B2 | 5/2015 | Fukagawa et al. |
| 9,076,970 B2 | 7/2015 | De Kok et al. |
| 9,236,420 B2 | 1/2016 | Lee et al. |
| 9,314,960 B2 | 4/2016 | Hatakeyama et al. |
| 9,324,733 B2 | 4/2016 | Rogers et al. |
| 9,394,415 B2 | 7/2016 | Hojo |
| 9,423,915 B2 | 8/2016 | Kang et al. |
| 9,557,589 B2 | 1/2017 | Park et al. |
| 9,761,816 B2 | 9/2017 | Lee et al. |
| 9,947,726 B2 | 4/2018 | Lee |
| 10,036,840 B2 | 7/2018 | Takeda et al. |
| 2005/0024561 A1 | 2/2005 | Elman et al. |
| 2006/0098153 A1 | 5/2006 | Slikkerveer et al. |
| 2007/0120444 A1 | 5/2007 | Kato et al. |
| 2007/0222909 A1 | 9/2007 | Slikkerveer et al. |
| 2008/0024700 A1 | 1/2008 | Yoshimi |
| 2008/0238306 A1* | 10/2008 | Takahashi ............ H01L 51/0011 313/504 |
| 2009/0096965 A1 | 4/2009 | Nagata |
| 2010/0283949 A1 | 11/2010 | Uchiyama et al. |
| 2011/0209901 A1 | 9/2011 | MacDonald et al. |
| 2011/0211135 A1 | 9/2011 | Sharp et al. |
| 2012/0105957 A1 | 5/2012 | Merrill et al. |
| 2013/0285938 A1 | 10/2013 | Kang et al. |
| 2014/0176880 A1* | 6/2014 | Cho ..................... G02B 5/3083 349/96 |
| 2014/0183478 A1 | 7/2014 | Lee et al. |
| 2014/0307395 A1* | 10/2014 | An ..................... H01L 27/3244 361/749 |
| 2014/0374704 A1* | 12/2014 | Jang .................... H01L 51/5256 257/40 |
| 2014/0375927 A1 | 12/2014 | Ishiguro et al. |
| 2015/0021570 A1* | 1/2015 | Kim .................... H01L 51/5293 257/40 |
| 2015/0145755 A1* | 5/2015 | Yamazaki ........... H01L 51/5262 345/76 |
| 2015/0378079 A1 | 12/2015 | Takagi et al. |
| 2016/0099428 A1 | 4/2016 | Lee et al. |
| 2016/0147352 A1 | 5/2016 | Filiz et al. |
| 2016/0195660 A1 | 7/2016 | Nakao |
| 2016/0365393 A1* | 12/2016 | Kim ..................... H01L 27/322 |
| 2017/0033310 A1* | 2/2017 | Mogi .................. H01L 51/0096 |
| 2017/0133407 A1* | 5/2017 | Sun .................... B29D 11/0073 |
| 2017/0135197 A1 | 5/2017 | Huitema |
| 2017/0186939 A1 | 6/2017 | Ando et al. |
| 2017/0277291 A1* | 9/2017 | Lee ......................... G06F 3/041 |
| 2018/0026212 A1* | 1/2018 | Hasegawa ........... H01L 51/5281 257/40 |

FOREIGN PATENT DOCUMENTS

| | | |
|---|---|---|
| CN | 104345492 A | 2/2015 |
| CN | 104345975 A | 2/2015 |
| CN | 104768728 A | 7/2015 |
| CN | 104885142 A | 9/2015 |
| CN | 104969101 A | 10/2015 |
| JP | 2009-92998 A | 4/2009 |
| JP | 2014-170221 A1 | 9/2014 |
| KR | 10-2013-0120721 A | 11/2013 |
| KR | 10-2014-0044279 A | 4/2014 |
| KR | 10-2014-0063910 A | 5/2014 |
| KR | 10-1459316 B1 | 11/2014 |
| KR | 10-2016-0036466 A | 4/2016 |
| WO | WO 2015/005122 A1 | 1/2015 |

OTHER PUBLICATIONS

Japan Patent Office, Notice of Reasons for Refusal, JP Patent Application No. 2016-091566, dated Mar. 3, 2020, 11 pages.

Korean Intellectual Property Office, Office Action, Korean Patent Application No. 10-2016-0124852, dated Aug. 10, 2018, six pages (with concise explanation of relevance).

Office Action for Korean Patent Application No. KR 10-2016-0124852, dated Dec. 15, 2017, 14 Pages, (With English Translation).

The State Intellectual Property Office of China, First Notification of Office Action, CN Patent Application No. 201611127235.2, dated Aug. 2, 2018, 18 pages.

China National Intellectual Property Administration, Office Action, CN Patent Application No. 201910414153.3, dated Nov. 27, 2020, 18 pages.

* cited by examiner

|  |  | first sample | second sample | third sample | fourth sample |
|---|---|---|---|---|---|
|  |  | stretch film of PET composition | | | panel of PET composition, PSA and PET composition |
| PET composition film(inside) | film thickness (μm) | 50 | 100 | | 50 |
| PSA | film thickness (μm) | | | | 25 |
| PET composition film(outside) | film thickness (μm) | | | | 50 |

ELECTRO-OPTICAL PANEL

CROSS-REFERENCE TO RELATED APPLICATIONS

This application is a continuation of U.S. application Ser. No. 15/366,785 filed on Dec. 1, 2016, which claims the priority benefit of Japanese Patent Application No. 2016-091566, filed on Apr. 28, 2016, both of which are incorporated herein by reference in their entirety.

BACKGROUND OF THE INVENTION

Technical Field

The present disclosure relates to an electro-optical panel, and more particularly, to an electro-optical panel including a display panel and an illumination panel.

Discussion of the Related Art

An electro-optical panel such as an organic light emitting diode (OLED) display panel, an OLED illumination panel, a cholesteric liquid crystal display (LCD) panel, polymer dispersed liquid crystal display (PDLC) panel and an electrophoretic display device includes a plurality of layers as well as an electro-optical element (for example, a light emitting element and a liquid crystal element). For example, such a panel may be described in Japanese Patent Publication No. 2015-152922.

In the present disclosure, 'an electro-optical element' includes a light emitting element (for example, an OLED element) which emits a light by an electrical interaction and a light controlling element (for example, a liquid crystal element) which controls a light transmittance by an electrical interaction, and 'an electro-optical panel' refers to a panel including the electro-optical element.

Recently, a flexible display panel and a flexible illumination panel have been developed. A flexible electro-optical panel of the flexible display panel includes a plurality of laminated films, and some of the plurality of laminated films include a polymeric material (for example, a resin).

The flexible electro-optical panel includes a bendable panel which can be bent, a rollable panel which can be rolled and a foldable panel which can be folded.

When the flexible electro-optical panel is kept in a transformed state (i.e., when the flexible electro-optical panel is left in a transformed state) for a long time, a transformation (i.e., a curl or a bending) remains. As a result, it is difficult for the flexible electro-optical panel to return to an original flat state even when the flexible electro-optical panel is respread to a flat state.

SUMMARY OF THE INVENTION

Embodiments of the present disclosure relate to an electro-optical panel that substantially obviates one or more of the problems due to limitations and disadvantages of the related art.

One embodiment is a flexible electro-optical panel which easily returns to an original flat state even when the flexible electro-optical panel is left in a transformed state for a long time.

Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings.

To achieve other advantages and features in accordance with the purpose according to one aspect of the disclosure, one embodiment is an electro-optical panel including: an electro-optical element emitting a light or adjusting a transmittance of a light; and a stretch film including a polymeric material, wherein a main stretching axis direction of the stretch film is disposed within 30° with respect to a side of the electro-optical panel.

In another aspect, another embodiment is an electro-optical panel including: an electro-optical element emitting a light or adjusting a transmittance of a light; and a plurality of stretch films including a polymeric material, wherein a main stretching axis direction of one of the plurality of stretch films which is closer to a light emitting surface of the electro-optical panel than others of the plurality of stretch films is disposed within 30° with respect to a side of the electro-optical panel.

In another aspect, another embodiment is an electro-optical panel including: an electro-optical element emitting a light or adjusting a transmittance of a light; and a first stretch film on a first surface of the electro-optical element, wherein a main stretching axis direction of the first stretch film is disposed within 30° with respect to a bending side of the electro-optical element, wherein the electro-optical panel is configured to be bent or rolled to cause bending in the bending side of the electro-optical element.

In another aspect, another embodiment is a flexible electro-optical panel comprising an electro-optical element comprising a thin film transistor layer and a light emitting layer, the thin film transistor layer configured to control emission or transmission of light from the light emitting layer. The electro-optical element is shaped to have two first edges and two second edges. The two first edges extend in a first direction, and the two second edges between the two first edges extend in a second direction that forms an angle relative to the first direction. The electro-optical element is bent more easily to cause bending of the two first edges than to cause bending of the two second edges. A stretch film is coupled to the electro-optical element, the stretch film having a main stretch direction that is within 30° from the first direction. In one aspect, flexible electro-optical panel may include one or more additional stretch films, wherein the one or more additional stretch films may be disposed between the stretch film and the electro-optical element. The stretch film may be a polarizing film and at least one of the one or more additional stretch films may be a retardation film. The polarizing film may be closer than the retardation film to a light-emitting surface of the flexible electro-optical panel. In another aspect, the flexible electro-optical panel may comprise one or more additional stretch films, wherein the stretch film is disposed between the one or more additional stretch films and the electro-optical element. At least one of the one or more additional stretch films may be a polarizing film; the stretch film may be a retardation film; and the polarizing film may be closer than the retardation film to a light-emitting surface of the flexible electro-optical panel.

In another aspect, another embodiment is a flexible electro-optical panel comprising an electro-optical element comprising a thin film transistor layer and a light emitting layer, the thin film transistor layer configured to control emission or transmission of light from the light emitting layer. The electro-optical element is shaped to have two first edges and two second edges. The two first edges extend in a first direction, and the two second edges between the two first edges extend in a second direction that forms an angle relative to the first direction. The electro-optical element is bent more easily to cause bending of the two first edges than to cause bending of the two second edges. The electro-optical element also includes a retardation film coupled to the electro-optical element and a polarizing film coupled to the retardation film, the polarizing film closer to a light-emitting surface of the flexible electro-optical panel than the retardation film and the electro-optical element. At least one of the polarizing film and the retardation film is a stretch film, the stretch film having a main stretch direction that is within 30° from the first direction. A film may be coupled to the electro-optical element, the film further away from the light-emitting surface of the flexible electro-optical panel than the retardation film and the polarizing film. The film may also be a stretch film having a main stretch direction that is within 30° from the first direction or the second direction.

It is to be understood that both the foregoing general description and the following detailed description are explanatory, and are intended to provide further explanation of the embodiments as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION OF THE EMBODIMENTS

Reference will now be made in detail to embodiments of the present disclosure, examples of which are illustrated in the accompanying drawings. In the following description, when a detailed description of well-known functions or configurations related to this document is determined to unnecessarily cloud a gist of an embodiment of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

Figure 1:
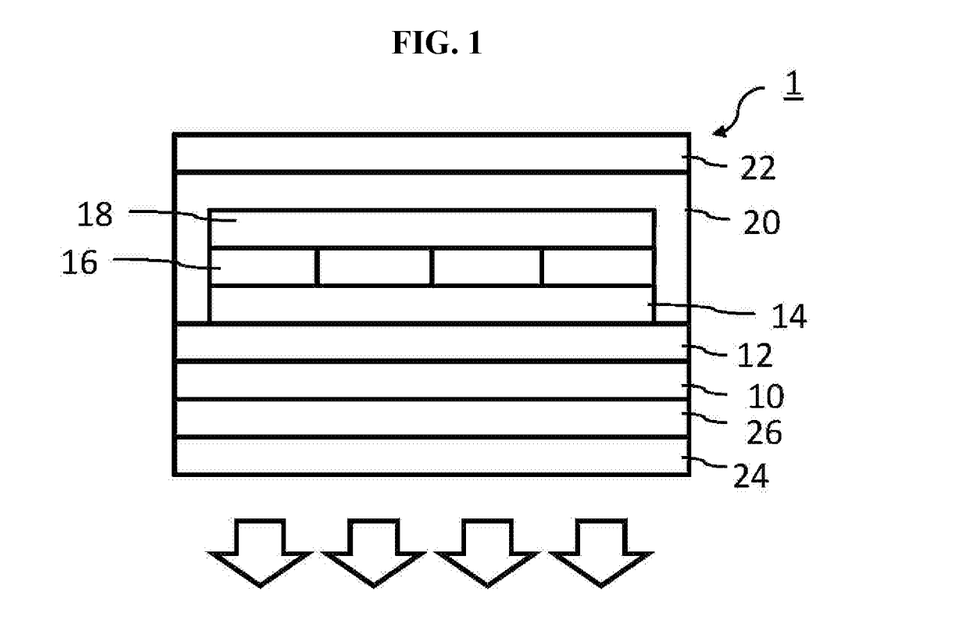
FIG. 1 is a cross-sectional view showing an organic light emitting diode display panel according to a first embodiment of the present disclosure.

FIG. 1 is a cross-sectional view showing an organic light emitting diode display panel according to a first embodiment of the present disclosure.

In FIG. 1, an organic light emitting diode (OLED) display panel 1 as an electro-optical panel includes a flexible substrate (flexible film) 10 and a barrier layer (barrier film) 12. The flexible substrate 10 may include a polymeric material, for example, polyimide, and the barrier layer 12 may include a polymeric material or an inorganic material.

A thin film transistor (TFT) layer 14, a color filter layer 16 and an OLED layer 18 as an electro-optical element are formed on the barrier layer 12. Although not shown, the TFT layer may include a plurality of TFTs and an interlayer insulating layer covering the plurality of TFTs. In addition, the color filter layer 16 may include a color filter and a conductive line connecting the TFT and an electrode of the OLED layer 18 through the interlayer insulating layer. The OLED layer 18 may include a plurality of layers such as an anode, a cathode and an emitting layer.

An encapsulator 20 is formed on the barrier layer 12. For example, the encapsulator 20 may include a glass or polyimide. The encapsulator 20 covers and protects the TFT layer 14, the color filter layer 16 and the OLED layer 18. In addition, a metallic sealing layer 22 is formed on the encapsulator 20.

The OLED display panel 1 has a bottom emission type where a light generated from the OLED layer 18 is emitted forward the flexible substrate 10 (i.e., downward direction of FIG. 1). A front film (a reinforcing film) 24 is attached to the flexible substrate 10 through an adhesive layer 26 for increasing a strength of the OLED display panel. For example, a pressure sensitive adhesive (PSA) may be used for the adhesive layer 26. The front film 24 may include a polymeric material such as polyethylene composition or polyethylene terephthalate (PET) composition. In another embodiment, the front film 24 may be attached directly to the flexible substrate 10 by an interaction of a covalent bond between materials of the front film 24 and the flexible substrate 10 or a cooperative interaction of a covalent bond and a molecular force.

Figure 2:
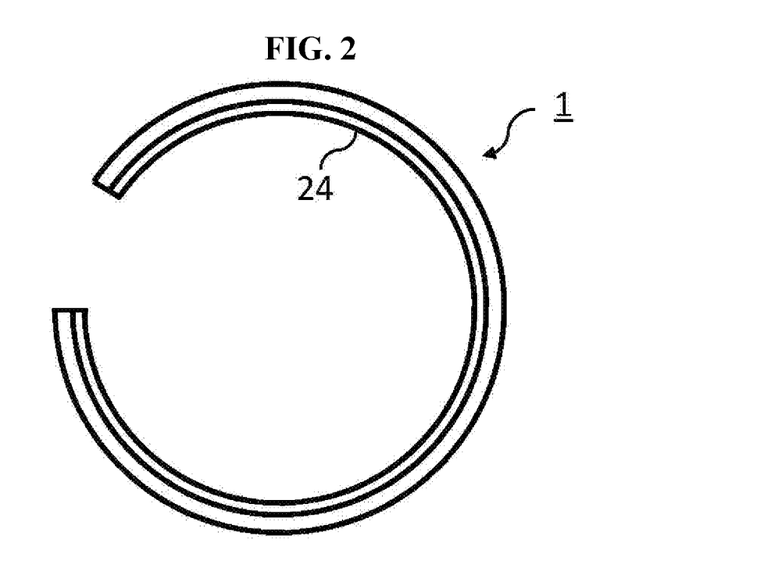
FIG. 2 is a cross-sectional view showing an organic light emitting diode display panel in a rolled state according to a first embodiment of the present disclosure.
Figure 3:
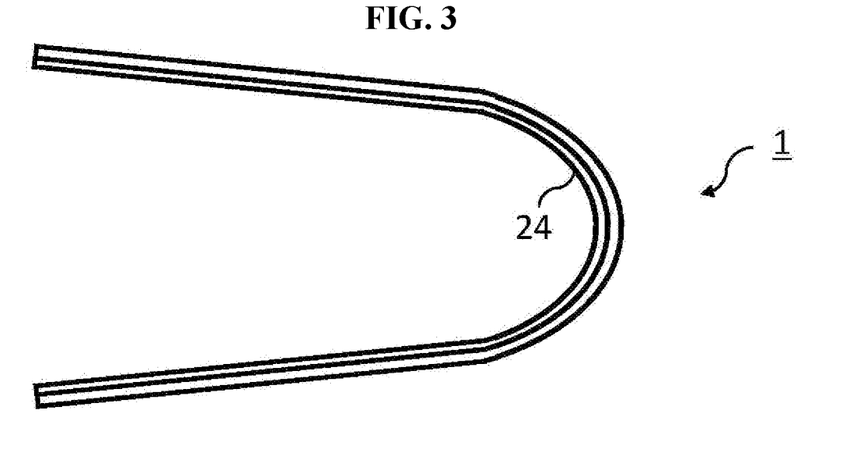
FIG. 3 is a cross-sectional view showing an organic light emitting diode display panel in a bent state according to a first embodiment of the present disclosure.

FIG. 2 is a cross-sectional view showing an organic light emitting diode display panel in a rolled state according to a first embodiment of the present disclosure, and FIG. 3 is a cross-sectional view showing an organic light emitting diode display panel in a bent state according to a first embodiment of the present disclosure.

In FIGS. 2 and 3, the flexible electro-optical panel 1 includes a bendable panel which can be bent, a rollerable panel which can be rolled and a foldable panel which can be folded. The OLED display panel 1 may be one of the bendable panel, the rollerable panel and the foldable panel. When the OLED display panel 1 is kept in a transformed state for a long time, a transformation (i.e., a curl or a bending) remains. Accordingly, the OLED display panel 1 is hard to return to an original flat state even when the OLED display panel 1 is respread to a flat state.

Figure 4:
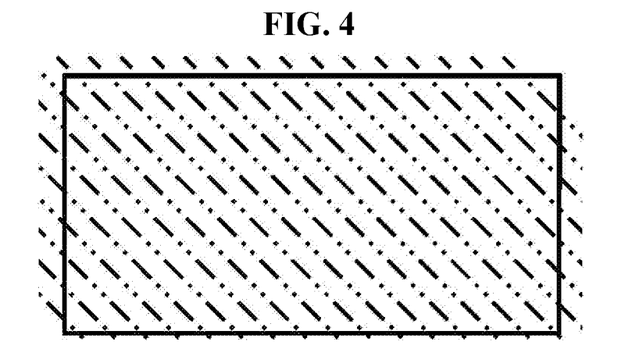
FIG. 4 is a plan view showing a main stretching axis of a front film (a stretch film) of an organic light emitting diode display panel of a rectangular shape in a flat state according to the related art.

FIG. 4 is a plan view showing a main stretching axis of a front film (a stretch film) of an organic light emitting diode display panel of a rectangular shape in a flat state according to the related art.

In FIG. 4, a broken line represents a main stretching axis direction of a stretch film. In the description of the present disclosure, the stretch film may be a uniaxial stretch film or a biaxial stretch film. A uniaxial stretch film can be more easily stretched in only one direction, referred to as the main stretching axis direction. A biaxial stretch film can be more easily stretched in two directions that are substantially perpendicular to each other. The main stretching axis direction of the biaxial film is one of the two directions, the direction along which the biaxial film is stretched for a largest distance when subject to a pulling force. In the related art, the main stretching axis direction of the stretch film is not focused on, and the main stretching axis direction of the stretch film of most of the OLED display panels may be about ±45° with respect to a long axis direction of the OLED display panel as shown in FIG. 4.

Figure 5:
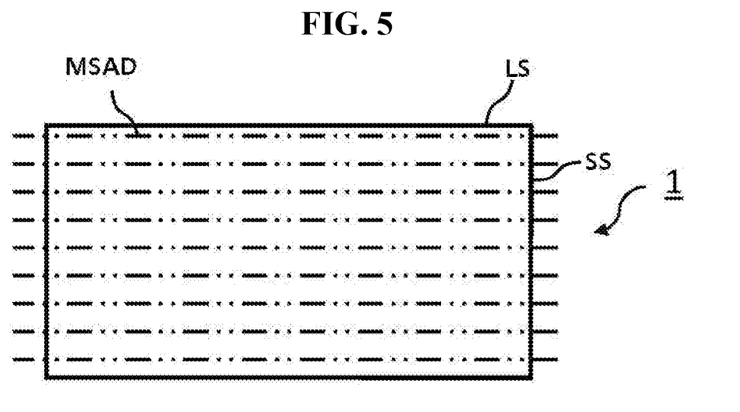
FIG. 5 is a plan view showing a main stretching axis of a front film (a stretch film) of an organic light emitting diode display panel of a rectangular shape in a flat state according to a first embodiment of the present disclosure.

FIG. 5 is a plan view showing a main stretching axis of a front film (a stretch film) of an organic light emitting diode display panel of a rectangular shape in a flat state according to a first embodiment of the present disclosure.

In FIG. 5, a main stretching axis direction MSAD of the stretch film 24 of the OLED display panel 1 may be parallel to a long axis direction (a long side LS) of the OLED display panel 1.

Figure 6:
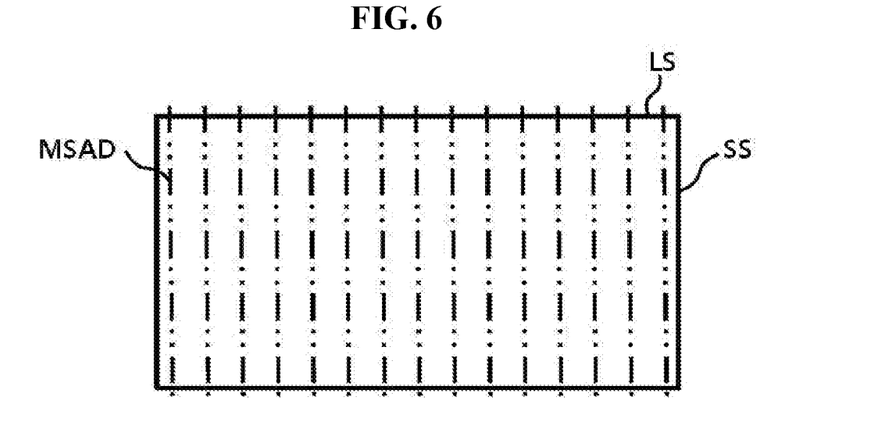
FIG. 6 is a plan view showing a main stretching axis of a front film (a stretch film) of an organic light emitting diode display panel of a rectangular shape in a flat state according to a second embodiment of the present disclosure.

FIG. 6 is a plan view showing a main stretching axis of a front film (a stretch film) of an organic light emitting diode display panel of a rectangular shape in a flat state according to a second embodiment of the present disclosure.

In FIG. 6, a main stretching axis direction MSAD of the stretch film of the OLED display panel may be parallel to a short axis direction (a short side SS) of the OLED display panel.

As shown in FIG. 5, the main stretching axis direction of the stretch film may be disposed to be parallel to the long axis direction of the OLED display panel 1 so that the OLED display panel 1 can easily return to an original flat state even when the OLED display panel 1 is left in a transformed state.

Figure 7:
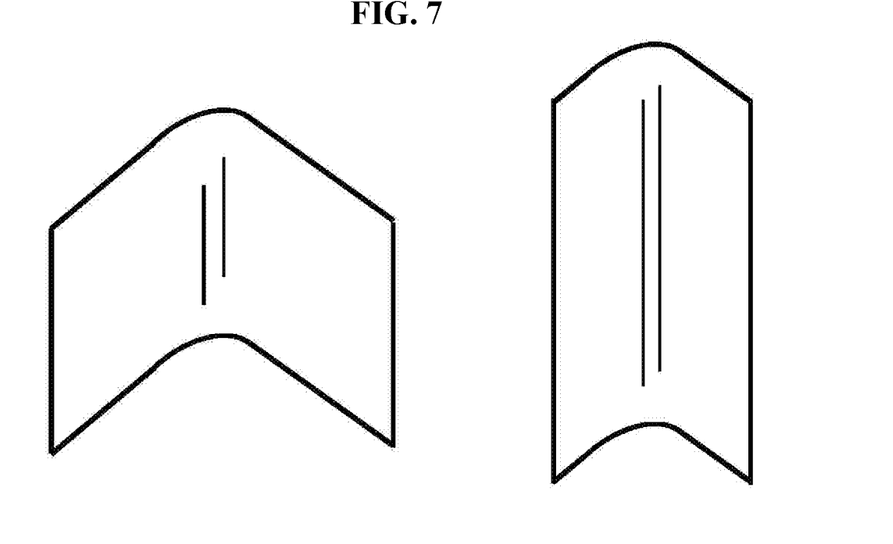
FIG. 7 is a view showing organic light emitting diode display panels where long and short axes are bent.

FIG. 7 is a view showing organic light emitting diode display panels where long and short axes are bent.

In FIG. 7, when the OLED display panel 1 is bent or rolled, users may usually bend or roll the long axis of the OLED display panel. For example, most of users may bend or roll the long axis as shown in the left drawing, and few of users may bend or roll the short axis as shown in the right drawing. When the main stretching axis direction of the stretch film is disposed to be parallel to the long axis direction of the OLED display panel, most of users may bend or roll the main stretching axis of the stretch film. Since the stretch film is transformed for a greater degree along the main stretching axis direction in the stretching process, the resilience is not lost and the stretch film and the OLED display panel including the stretch film do not have difficulty returning to a flat state even when the stretch film is left in the transformed state where the main stretching axis is bent or rolled.

Figure 8:
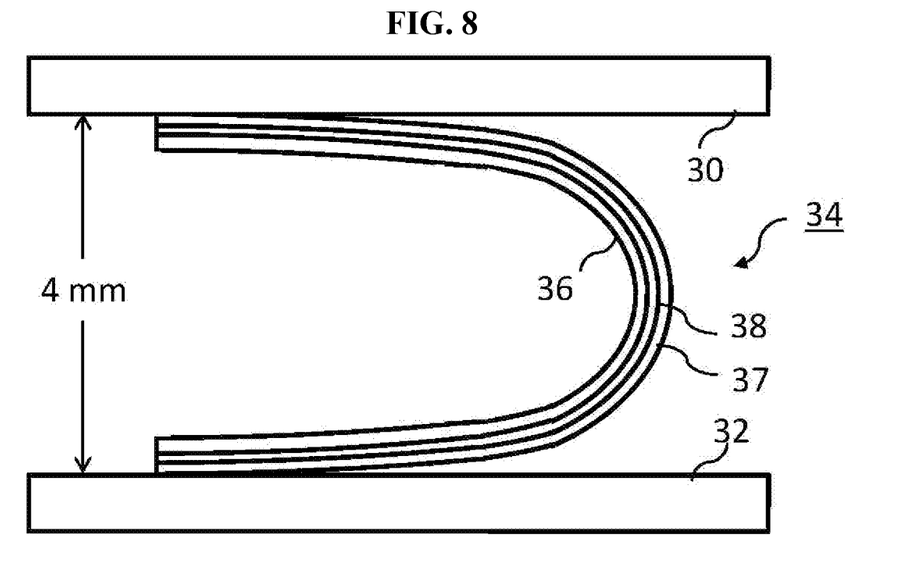
FIG. 8 is a view showing a method of an experiment for an organic light emitting diode display panel according to a first embodiment of the present invention.

For verifying the above effects, several experiments have been performed. FIG. 8 is a view showing a method of an experiment for an organic light emitting diode display panel according to a first embodiment of the present invention, and FIG. 9 is a view showing a method of measuring a remaining transformation rate of an experiment of FIG. 8.

In FIG. 8, a sample 34 is left in a bent state between two glass substrates 30 and 32 which have a gap distance of about 4 mm under a temperature of about 60° C. for about 24 hours.

Figure 9:
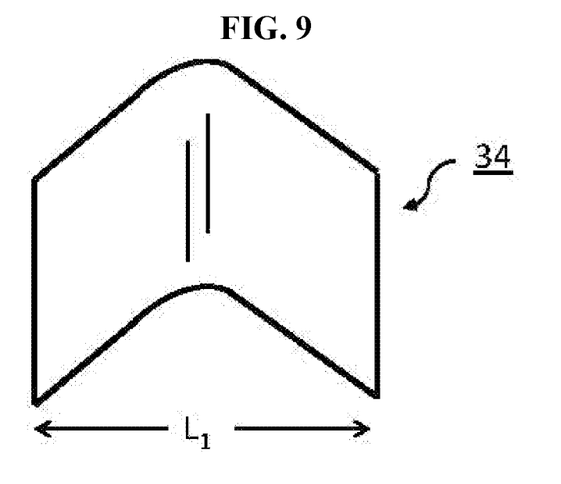
FIG. 9 is a view showing a method of measuring a remaining transformation rate of an experiment of FIG. 8.

In FIG. 9, a transformation remains in the sample 34. For example, a first length (or width) $L_1$ of the sample 34 having the transformation is shorter than a length (or width) L of the sample 34 of an original flat state. A remaining transformation rate R is calculated according to an equation (1).

$$R=(L-L_1)/L \tag{1}$$

Figure 10:
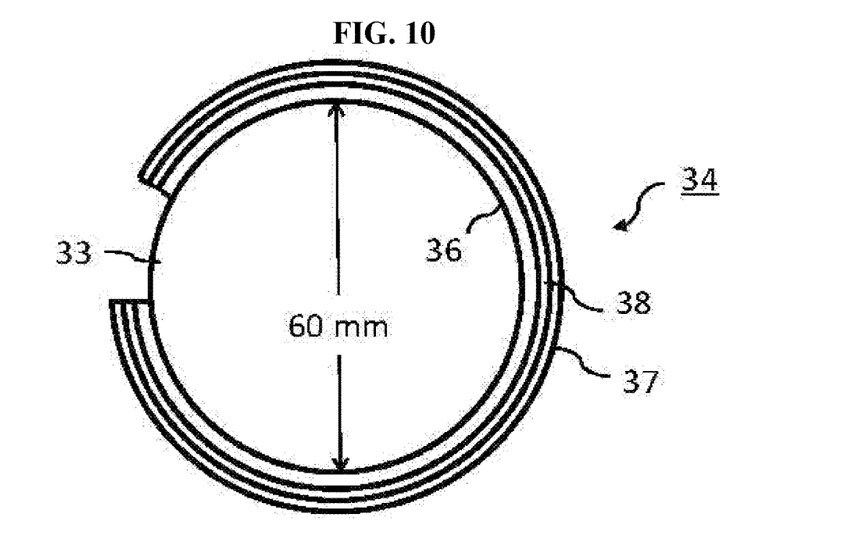
FIG. 10 is a view showing a method of another experiment for a organic light emitting diode display panel according to a first embodiment of the present invention.

FIG. 10 is a view showing a method of another experiment for an organic light emitting diode display panel according to a first embodiment of the present invention.

In FIG. 10, a sample 34 is rolled around a rigid cylinder 33 having a diameter of about 60 mm and the sample 34 is left under a temperature of about 60° C. for about 24 hours. A transformation remains in the sample 34, and a remaining transformation rate R is calculated according to the equation (1).

Before the above two experiments of FIGS. 8 and 10, a stretch film is observed through a crossed nicols method using a polarizing microscope to judge a main stretching axis direction.

Figure 11:
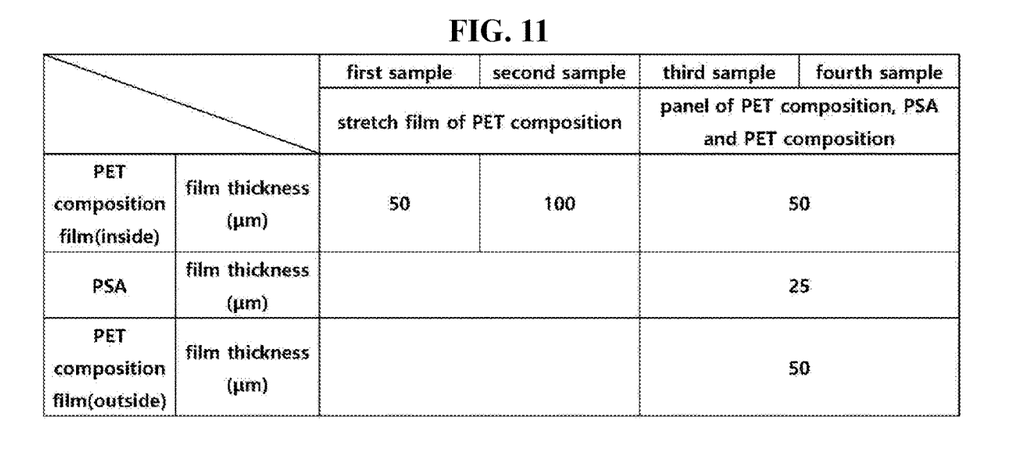
FIG. 11 is a table showing samples for experiments of FIGS. 8 and 10.

FIG. 11 is a table to describe samples for experiments of FIGS. 8 and 10.

In FIG. 11, a first sample is a stretch film consisting of a polyethylene terephthalate (PET) composition and having a thickness of about 50 μm. The PET composition may include polyethylene terephthalate as a main component and an additive. A second sample is a stretch film consisting of a PET composition and having a thickness of about 100 μm. Each of third and fourth samples is a panel including two stretch films 36 and 37 of a PET composition and an adhesive layer 38 of a pressure sensitive adhesive (PSA) attaching the two stretch films 36 and 37 as shown in FIGS. 8 and 10. While main stretching axes directions of the two stretch films 36 and 37 are parallel to each other in the third sample, main stretching axes directions of the two stretch films 36 and 37 are perpendicular to each other in the fourth sample.

Figure 12:
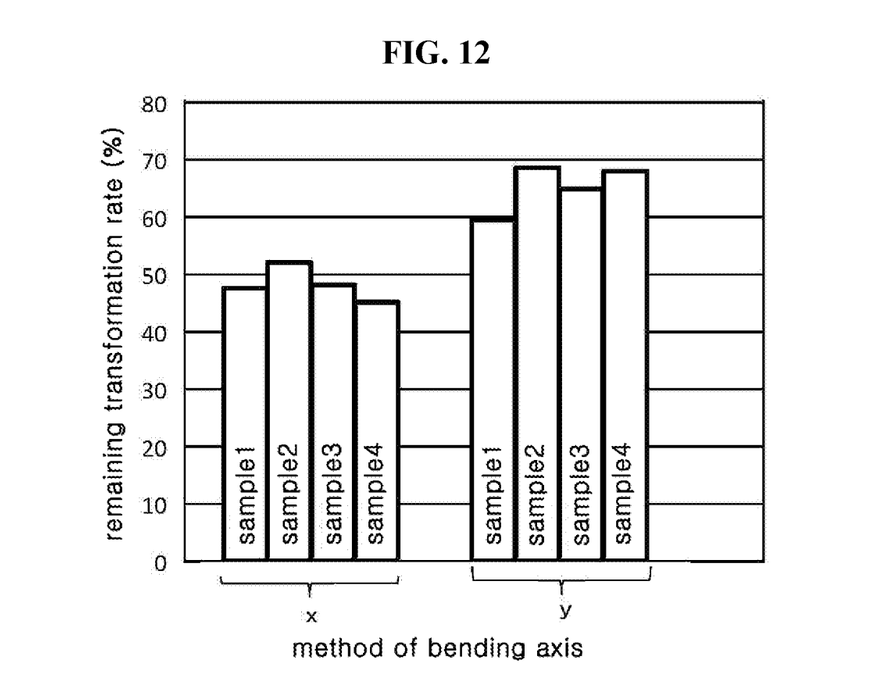
FIG. 12 is a graph showing a result of an experiment of FIG. 8.

FIG. 12 is a graph showing a result of an experiment of FIG. 8.

In FIG. 12, the first to fourth samples are bent through methods of bending axis x and y. In the method of bending axis x, the main stretching axes of the first, second and third samples are bent and the main stretching axis of the inner stretch film 36 (i.e., an axis perpendicular to the main stretching axis of the outer stretch film 37) of the fourth sample is bent. In the method of bending axis y, an axis perpendicular to the main stretching axes of the first, second and third samples are bent and an axis perpendicular to the main stretching axis of the inner stretch film 36 (i.e., the main stretching axis of the outer stretch film 37) of the fourth sample is bent.

Figure 13:
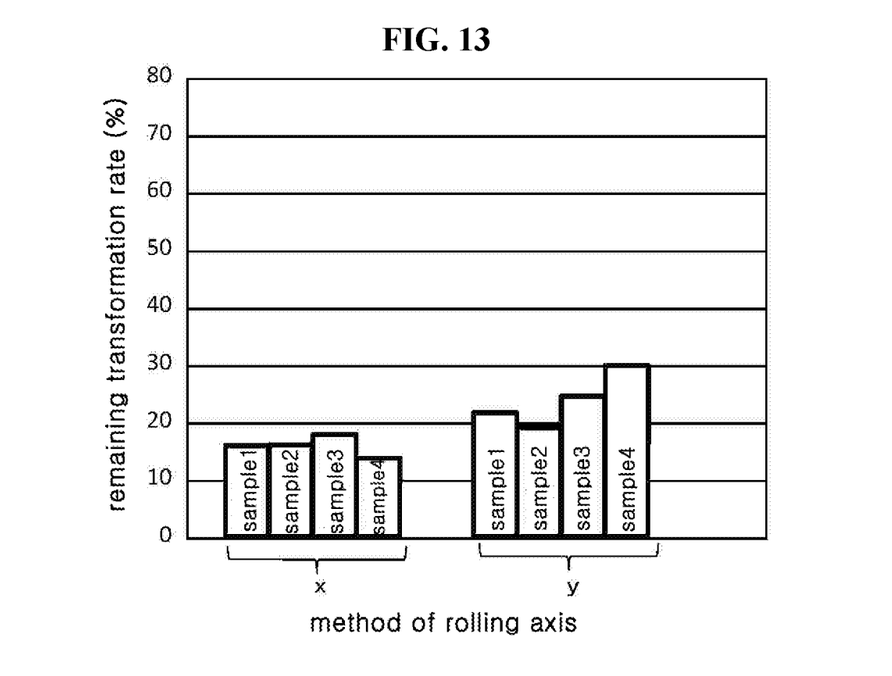
FIG. 13 is a graph showing a result of an experiment of FIG. 10.

FIG. 13 is a graph showing a result of an experiment of FIG. 10.

In FIG. 13, the first to fourth samples are bent through methods of rolling axis x and y. In the method of rolling axis x, the main stretching axes of the first, second and third samples are rolled and the main stretching axis of the inner stretch film 36 (i.e., an axis perpendicular to the main stretching axis of the outer stretch film 37) of the fourth sample is rolled. In the method of rolling axis y, an axis perpendicular to the main stretching axes of the first, second and third samples are rolled and an axis perpendicular to the main stretching axis of the inner stretch film 36 (i.e., the main stretching axis of the outer stretch film 37) of the fourth sample is rolled.

In FIGS. 12 and 13, a remaining transformation rate through the methods of bending axis and rolling axis x is smaller than a remaining transformation rate through the methods of bending axis and rolling axis y. For the first and second samples of a single stretch film, the remaining transformation rate of the case where the main stretching axis is bent or rolled is smaller than the remaining transformation rate of the case where the axis perpendicular to the main stretching axis is bent or rolled. For the third sample of a plurality stretch films of which main stretching axis directions are parallel to each other, the remaining transformation rate of the case where the main stretching axis is bent or rolled is smaller than the remaining transformation rate of the case where the axis perpendicular to the main stretching axis is bent or rolled. For the fourth sample of a plurality stretch films of which main stretching axis directions are perpendicular to each other, the remaining transformation rate of the case where the main stretching axis of the inner stretch film 36 is bent or rolled is smaller than the remaining transformation rate of the case where the main stretching axis of the outer stretch film 37 is bent or rolled. In addition, the remaining transformation rate of the fourth sample through the method of bending axis and rolling axis x is smaller than the remaining transformation rate of each of the first and second samples of a single stretch film.

Since a user generally bends or rolls the long axis of the OLED display panel, it may be preferable that the main stretching axis direction of the stretch film is disposed to be parallel to the long axis direction of the OLED display panel. As shown in FIGS. 12 and 13, it is verified from the result of the experiments that the main stretching axis direction of the stretch film parallel to the long axis direction of the OLED display panel is preferable for the first and second samples of the single stretch film and the main stretching axis direction of the plurality of stretch films parallel to the long axis direction of the OLED display panel is preferable for the third sample of the plurality of stretch films. In addition, it is verified from the result of the experiments that the main stretching axis direction of the inner stretch film parallel to the long axis direction of the OLED display panel is preferable for the fourth sample of the plurality of stretch films.

Figure 14:
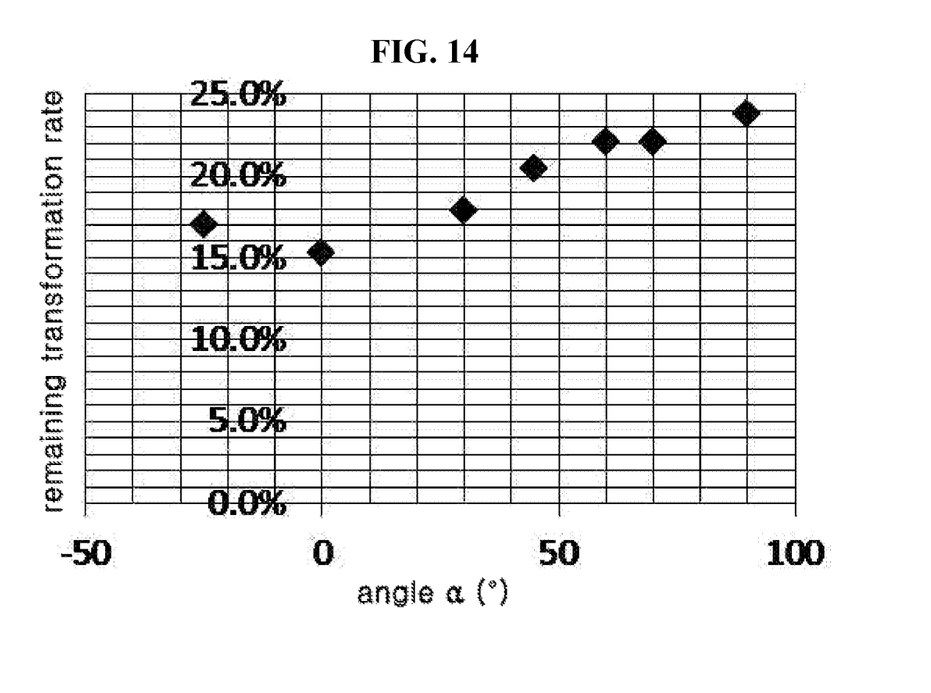
FIG. 14 is a graph showing a result of an experiment for various directions of a main stretching axis of a stretch film.
Figure 15:
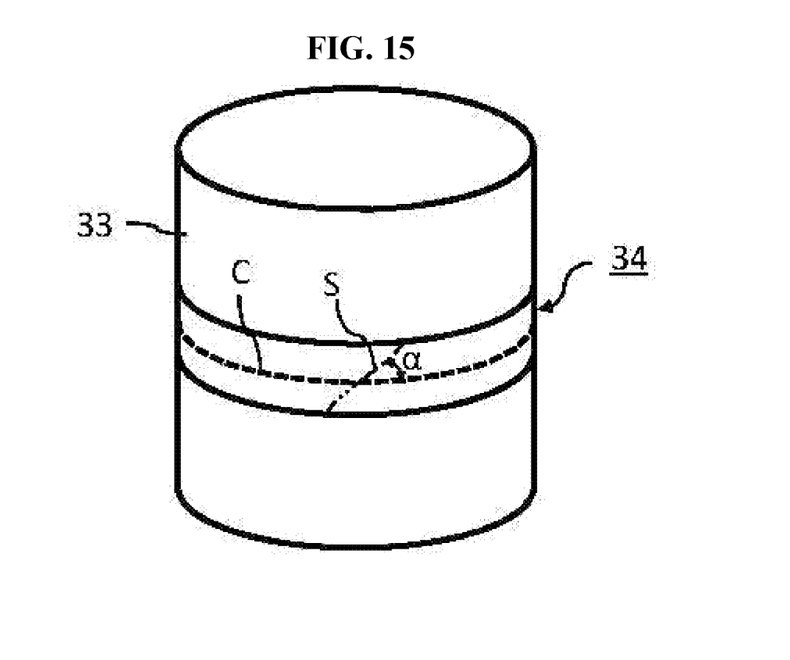
FIG. 15 is a perspective view showing an angle of a main stretching axis direction of a stretch film.

FIG. 14 is a graph showing a result of an experiment for various directions of a main stretching axis of a stretch film, and FIG. 15 is a perspective view showing an angle of a main stretching axis direction of a stretch film.

In FIGS. 14 and 15, the first sample of a stretch film consisting of a PET composition and having a thickness of about 50 µm is used as the sample 34 of FIG. 10. Before the experiment, the stretch film is observed through a crossed nicols method using a polarizing microscope to judge a main stretching axis direction. The sample 34 is rolled around the rigid cylinder 33 having a diameter of about 60 mm such that the main stretching axis direction S makes an angle α with respect to a circumferential direction C of the cylinder 33. For example, the sample may have various angles α of about –25°, about 00, about 30°, about 45°, about 60°, about 70° and about 90°. In addition, the sample 34 is left under a temperature of about 60° C. for about 24 hours.

When the angle α is about 0°, a remaining transformation rate is minimized. When the angle α is about –25° and about 30°, the remaining transformation rate is similar to that of the angle α of about 0°. When the angle α is about 35° and about 45°, the remaining transformation rate is much greater than that of the angle α of about 0°. The positive and the negative of the angle α may not affect the remaining transformation rate, and the angles α of the same absolute value may have the same remaining transformation rate.

It is preferable from the result of FIG. 14 that the angle α is within a range of about ±30°. As a result, it is preferable for the first and second samples of a single stretch film that the main stretching axis direction of the stretch film has the angle α within a range of about ±30° with respect to the long axis direction of the OLED display panel, and it is preferable for the third sample of a plurality of stretch films that the main stretching axis direction of the plurality of stretch films has the angle α within a range of about ±30° with respect to the long axis direction of the OLED display panel. In addition, it is preferable for the fourth sample of a plurality of stretch films that the main stretching axis direction of the inner stretch film has the angle α within a range of about ±30° with respect to the long axis direction of the OLED display panel.

Accordingly, in a flexible electro-optical panel 1 including an electro-optical element 18 and a stretch film of a polymeric material, if a main stretching axis direction of the stretch film is disposed within a range of about ±30° with respect to a long axis direction of the electro-optical panel 1, the flexible electro-optical panel 1 may easily return to an original flat state even when the flexible electro-optical panel 1 is left in a transformed state for a long time.

A user generally bends or rolls the OLED display panel such that a light emitting surface is disposed at an inner portion. Accordingly, for the fourth sample of the plurality of stretch films having different main stretching axis directions, it is preferable that the main stretching axis direction of the stretch film disposed at the light emitting surface is disposed within a range of about ±30° with respect to a long axis direction of the OLED display panel.

In the first embodiment, it is preferable that the main stretching axis direction of the stretch film is within a range of about ±30° with respect to the long axis direction of the electro-optical panel 1. However, in an electro-optical panel 1 such as a scroll type projector screen, a short axis of the electro-optical panel 1 may be bent or rolled. In addition, a short axis of an electro-optical panel 1 may be bent or rolled for configuration of the other components. In the electro-optical panel 1 where the short axis is bent or rolled, when the main stretching axis direction of the stretch film is within a range of about ±30° (preferably parallel to) with respect to the short axis direction (a direction perpendicular to the long axis direction) of the electro-optical panel 1, the main stretching axis is bent or rolled. As a result, it is preferable for the electro-optical panel 1 where the short axis is bent or rolled that the main stretching axis direction of the stretch film is within a range of about ±30° (preferably parallel to) with respect to the short axis direction of the electro-optical panel 1.

When an electro-optical panel 1 has a square shape, it is preferable that a main stretching axis direction of a stretch film is within a range of about ±30° with respect to one of four sides of the electro-optical panel 1. In addition, a mark or a notice regarding a direction for bending or rolling may be attached to the electro-optical panel 1.

Figure 16:
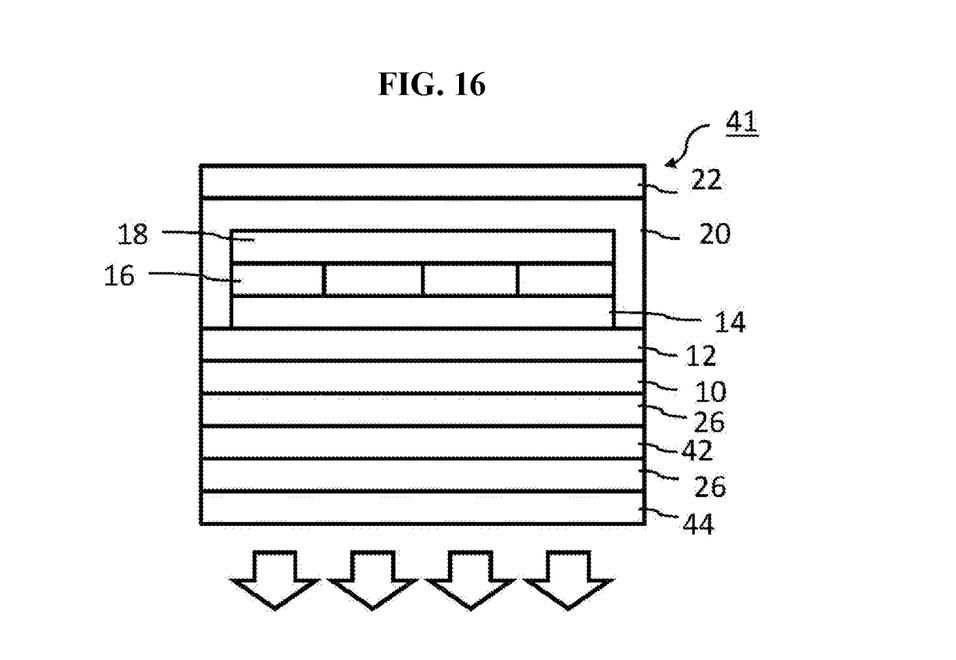
FIG. 16 is a cross-sectional view showing an organic light emitting diode display panel according to a third embodiment of the present disclosure.

FIG. 16 is a cross-sectional view showing an organic light emitting diode display panel according to a third embodiment of the present disclosure.

In FIG. 16, an organic light emitting diode (OLED) display panel 41 having a bottom emission type further includes a retardation film 42 and a polarizing film 44. For reducing reflection of an external light, the retardation film 42 is disposed closer to a light emitting surface than a flexible substrate 10, and the polarizing film 44 is disposed closer to the light emitting surface than the retardation film 42. The retardation film 42 and the polarizing film 44 are a stretch film of a polymeric material. The retardation film 42 is attached to the flexible substrate 10 through an adhesive 26, and the polarizing film 44 is attached to the retardation film 42 through an adhesive 26. In another embodiment, the retardation film 42 may be attached directly to the flexible substrate 10 by an interaction of a covalent bond between materials of the retardation film 42 and the flexible substrate 10 or a cooperative interaction of a covalent bond and a molecular force. Similarly, the polarizing film 44 may be attached directly to the retardation film 42.

Since the polarizing film 44 is disposed closer to the light emitting surface than the retardation film 42, the polarizing film 44 may be disposed at an inner portion when the OLED display panel 41 is bent or rolled. As a result, it is preferable that a main stretching axis direction of the polarizing film 44 is disposed within a range of about ±30° with respect to one of four sides of the OLED display panel 41. The retardation film 42 is not aligned based on a main stretching axis direction. Instead, the retardation film 42 is aligned based on a performance of reducing reflection of an external light due to a cooperative interaction with the polarizing film 44. As a result, the retardation film 42 is aligned based on an optical property instead of the main stretching axis direction.

Figure 17:
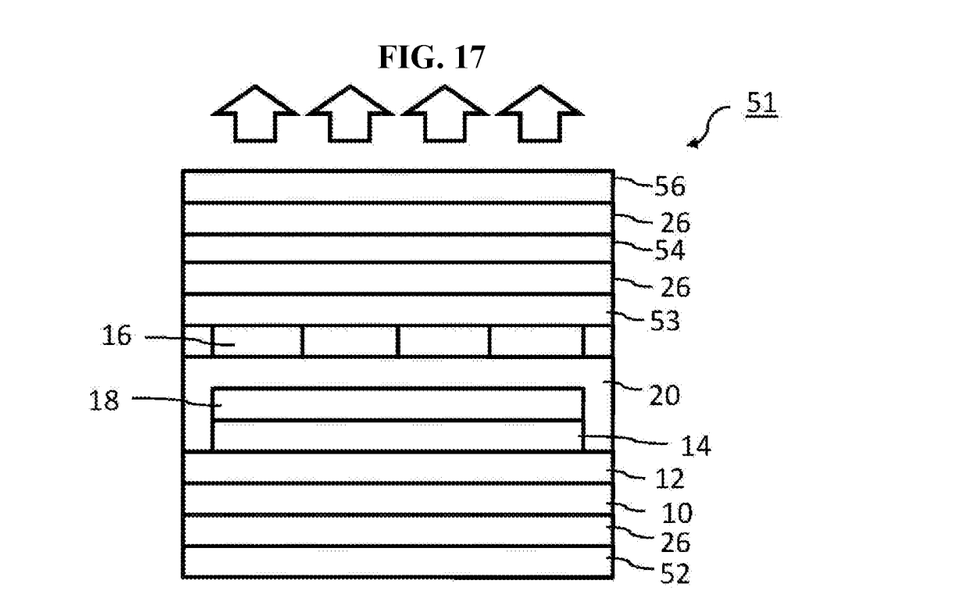
FIG. 17 is a cross-sectional view showing an organic light emitting diode display panel according to a fourth embodiment of the present disclosure.

FIG. 17 is a cross-sectional view showing an organic light emitting diode display panel according to a fourth embodiment of the present disclosure.

In FIG. 17, an organic light emitting diode (OLED) display panel 51 having a top emission type further includes a retardation film 54 and a polarizing film 56. For reducing reflection of an external light, the retardation film 54 is disposed closer to a light emitting surface than a flexible substrate 10, and the polarizing film 56 is disposed closer to the light emitting surface than the retardation film 54. The retardation film 54 and the polarizing film 56 are a stretch film of a polymeric material. The retardation film 54 is attached to a flexible substrate 53 on a color filter layer 16 through an adhesive 26, and the polarizing film 56 is attached to the retardation film 54 through an adhesive 26. In another embodiment, the retardation film 54 may be attached directly to flexible substrate 53 by an interaction of a covalent bond between materials of the retardation film 54 and the flexible substrate 53 or a cooperative interaction of a covalent bond and a molecular force. Similarly, the polarizing film 56 may be attached directly to the retardation film 54.

In addition, a back film 52 is attached to the flexible substrate 10 through an adhesive 26. In another embodiment, the back film 52 may be attached directly to flexible substrate 10 by an interaction of a covalent bond between materials of the back film 52 and the flexible substrate 10 or a cooperative interaction of a covalent bond and a molecular force.

Since the polarizing film 56 is disposed closer to the light emitting surface than the retardation film 54, the polarizing film 56 may be disposed at an inner portion when the OLED display panel 51 is bent or rolled. As a result, it is preferable that a main stretching axis direction of the polarizing film 56 is disposed within a range of about ±30° with respect to one of four sides of the OLED display panel 51. The retardation film 54 is not aligned based on a main stretching axis direction. Instead, the retardation film 54 is aligned based on a performance of reducing reflection of an external light due to a cooperative interaction with the polarizing film 56. As a result, the retardation film 54 is aligned based on an optical property instead of the main stretching axis direction.

Similarly to the polarizing film 56, it is preferable that a main stretching axis direction of the flexible substrate 53 is disposed within a range of about ±30° with respect to with respect to one of four sides of the OLED display panel 51. However, the main stretching axis direction of the flexible substrate 53 is not limited to the above range. In addition, although it is preferable that a main stretching axis direction of the back film 52 is disposed within a range of about ±30° with respect to one of four sides of the OLED display panel 51, the main stretching axis direction of the back film 52 is not limited to the above range.

In the third and fourth embodiments, a user is assumed to bend or roll the electro-optical panel 1 such that a light emitting surface is disposed at an inner portion. However, a user may bend or roll the electro-optical panel 1 such that a light emitting surface is disposed at an outer portion. When the electro-optical panel 1 including a plurality of stretch films having different main axis directions is bent or rolled such that a light emitting surface is disposed at an outer portion, it is preferable that a main stretching axis direction of a stretch film farther from the light emitting surface is disposed within a range of about ±30° with respect to a long axis direction of the electro-optical panel 1. In addition, a mark or a notice regarding a direction for bending or rolling may be attached to the electro-optical panel 1.

When the OLED display panel 41 of FIG. 16 is bent or rolled such that a light emitting surface is disposed at an outer portion, it is preferable that the main stretching axis direction of the retardation film 42 disposed at an inner portion than the polarizing film 44 is disposed within a range of about ±30° with respect to one of four sides of the OLED display panel 41. The polarizing film 44 is not aligned based on a main stretching axis direction. Instead, it is preferable that the polarizing film 44 is aligned based on a performance of reducing reflection of an external light due to a cooperative interaction with the retardation film 42. Similarly, when the OLED display panel 51 of FIG. 17 is bent or rolled such that a light emitting surface is disposed at an outer portion, it is preferable that the main stretching axis direction of the retardation film 54 disposed at an inner portion than the polarizing film 56 is disposed within a range of about ±30° with respect to one of four sides of the OLED display panel 51. The polarizing film 56 is not aligned based on a main stretching axis direction. Instead, it is preferable that the polarizing film 56 is aligned based on a performance of reducing reflection of an external light due to a cooperative interaction with the retardation film 54.

Figure 18:
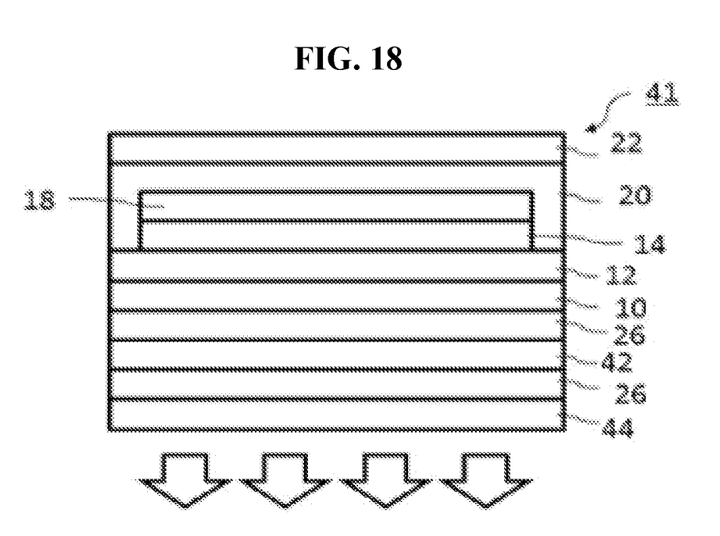
FIG. 18 is a cross-sectional view showing an organic light emitting diode display panel according to a fifth embodiment of the present disclosure.
Figure 19:
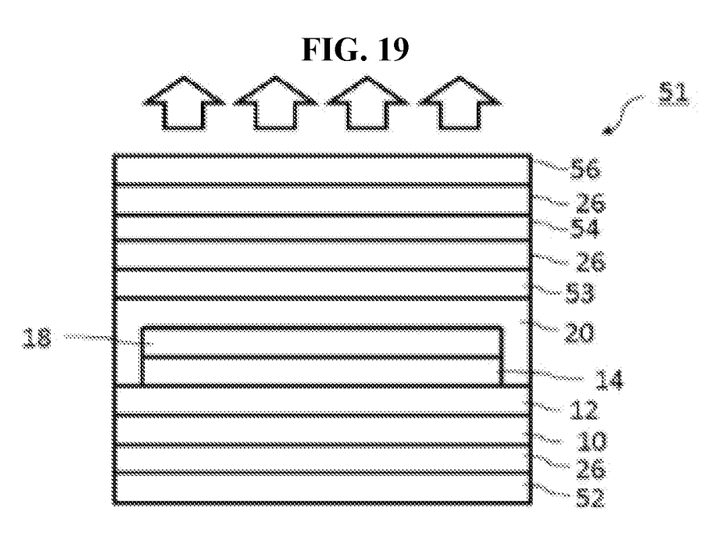
FIG. 19 is a cross-sectional view showing an organic light emitting diode display panel according to a sixth embodiment of the present disclosure.

FIG. 18 is a cross-sectional view showing an organic light emitting diode display panel according to a fifth embodiment of the present disclosure, and FIG. 19 is a cross-sectional view showing an organic light emitting diode display panel according to a sixth embodiment of the present disclosure.

Although the OLED display panels 41 and 51 of FIGS. 16 and 17 include a color filter layer 16, the OLED display panels 41 and 51 of FIGS. 18 and 19 do not include a color filter layer.

Consequently, in a flexible electro-optical panel 1 having a stretch film, since a main stretching axis direction is disposed within a range of about ±30° with respect to a side of the electro-optical panel 1, the electro-optical panel 1 easily returns to an original flat state even when the electro-optical panel 1 is left in a transformed state for a long time. When the electro-optical panel 1 is bent or rolled, a user may generally bend or roll a long axis of the electro-optical panel 1. If the main stretching axis direction of the stretch film is disposed within a range of about ±30° (preferably parallel to) with respect to a long axis direction of the electro-optical panel 1, a user may bend or roll the main stretching axis of the stretch film while the electro-optical panel 1 is bent or rolled. In an electro-optical panel 1 such as a scroll type projector screen, a short axis of the electro-optical panel 1 is bent or rolled. In addition, a short axis of an electro-optical panel 1 is bent or rolled for configuration of the other components. In the electro-optical panel 1 where the short axis is bent or rolled, when a main stretching axis direction of the stretch film is within a range of about ±30° (preferably parallel to) with respect to the short axis direction (a direction perpendicular to a long axis direction) of the electro-optical panel 1, the main stretching axis is bent or rolled. Since the stretch film is more largely transformed along the main stretching axis direction in the stretching process, the resilience is not lost and the stretch film and the electro-optical panel 1 including the stretch film do not have difficulty returning to a flat state even when the stretch film is left in the transformed state where the main stretching axis is bent or rolled. When an electro-optical panel 1 has a square shape, a main stretching axis direction of a stretch film is within a range of about ±30° with respect to one side of the electro-optical panel 1. Moreover, a mark or a notice regarding a direction for bending or rolling may be attached to the electro-optical panel 1.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of fabricating a flexible display panel comprising:

forming an electro-optical element emitting a light or adjusting a transmittance of a light;

forming a first stretch film on a first surface of the electro-optical element; and forming a plurality of second stretch films between the first stretch film and the electro-optical element, wherein a main stretching axis direction of the first stretch film is disposed within 30° with respect to a bending side of the electro-optical element, and wherein the electro-optical element is bent such that the first surface of the electro-optical element is disposed at an inner portion, and wherein the plurality of second stretch films are aligned based on a performance of reducing reflection of an external light due to a cooperative interaction with the first stretch film.

2. The method of claim 1, wherein the electro-optical panel is configured to be bent or rolled to cause bending in the bending side of the electro-optical element.

3. The method of claim 1, wherein the first stretch film includes a polarizing film and the plurality of second stretch films include a retardation film.

4. The method of claim 3, wherein the electro-optical element emits a light through the first surface.

5. The method of claim 1, wherein the first stretch film is a biaxial stretch film having two stretching axis directions perpendicular to each other, and wherein the main stretching axis direction is one of the two stretching axis directions of the biaxial stretch film where the biaxial stretch film is stretched for a largest distance when subject to a pulling force.

6. The method of claim 1, wherein forming the electro-optical element comprises:

forming a thin film transistor layer on a flexible substrate; and forming an organic light emitting diode layer on the thin film transistor layer.

7. The method of claim 6, wherein forming the electro-optical element further comprises:

forming a barrier layer between the flexible substrate and the thin film transistor layer;

forming an encapsulator on the organic light emitting diode layer; and forming a metallic sealing layer on the encapsulator.

8. The method of claim 6, wherein forming the electro-optical element further comprises forming a color filter layer between the thin film transistor layer and the organic light emitting diode layer.

9. A method of fabricating a flexible display panel, comprising, forming an electro-optical element emitting a light or adjusting a transmittance of a light;

forming a first stretch film on a first surface of the electro-optical element; and forming a plurality of second stretch films on an outer surface of the first stretch film, wherein a main stretching axis direction of the first stretch film is disposed within 30° with respect to a bending side of the electro-optical element, and wherein the electro-optical element is bent such that the first surface of the electro-optical element is disposed at an outer portion, and wherein the plurality of second stretch films are aligned based on a performance of reducing reflection of an external light due to a cooperative interaction with the first stretch film.

10. The method of claim 9, wherein the first stretch film includes a retardation film and the plurality of second stretch films include a polarizing film.

11. The method of claim 10, wherein the electro-optical element emits a light through a second surface opposite to the first surface.

* * * * *